US009443583B2

(12) United States Patent
Pacha et al.

(10) Patent No.: US 9,443,583 B2
(45) Date of Patent: Sep. 13, 2016

(54) RESISTIVE MEMORY AND METHOD

(75) Inventors: Christian Pacha, Munich (DE); Tim Schönauer, Feldkirchen (DE); Michael Kund, Tuntenhausen (DE)

(73) Assignee: Infineon Technologies AG, Neubiberg (DE)

( * ) Notice: Subject to any disclaimer, the term of this patent is extended or adjusted under 35 U.S.C. 154(b) by 751 days.

(21) Appl. No.: 13/270,592

(22) Filed: Oct. 11, 2011

(65) Prior Publication Data

US 2012/0026781 A1 Feb. 2, 2012

Related U.S. Application Data

(62) Division of application No. 11/687,365, filed on Mar. 16, 2007, now Pat. No. 8,063,448.

(51) Int. Cl.
*G11C 19/08* (2006.01)
*G11C 13/00* (2006.01)
*H01L 27/24* (2006.01)
*H01L 45/00* (2006.01)
*H01L 29/78* (2006.01)

(52) U.S. Cl.
CPC ....... *G11C 13/0011* (2013.01); *G11C 13/0004* (2013.01); *G11C 13/0007* (2013.01); *H01L 27/2436* (2013.01); *H01L 45/04* (2013.01); *H01L 45/06* (2013.01); *H01L 45/085* (2013.01); *H01L 45/1273* (2013.01); *H01L 45/145* (2013.01); *G11C 2213/32* (2013.01); *H01L 29/785* (2013.01)

(58) Field of Classification Search
CPC ........ G11C 19/08; H01F 10/00; B82Y 10/00
USPC .............................. 365/34, 113, 164
See application file for complete search history.

(56) References Cited

U.S. PATENT DOCUMENTS

| 6,928,022 | B2 | 8/2005 | Cho et al. |
| 7,023,008 | B1 | 4/2006 | Happ |
| 7,133,307 | B2 | 11/2006 | Baker |
| 2002/0126524 | A1 | 9/2002 | Sugibayashi |
| 2005/0237850 | A1* | 10/2005 | Datta et al. ............ 365/232 |
| 2005/0263801 | A1 | 12/2005 | Park et al. |
| 2007/0019479 | A1 | 1/2007 | Kim et al. |
| 2008/0121862 | A1* | 5/2008 | Liu .................... 257/4 |

FOREIGN PATENT DOCUMENTS

DE 102005046426 A1 4/2006
KR 2006002617 A 1/2006

OTHER PUBLICATIONS

Non-Final Office Action dated Jan. 21, 2011 in connection with U.S. Appl. No. 11/687,365.
Notice of Allowance dated Jul. 18, 2011 in connection with U.S. Appl. No. 11/687,365.

* cited by examiner

*Primary Examiner* — Jason Lappas
(74) *Attorney, Agent, or Firm* — Eschweiler & Associates, LLC

(57) ABSTRACT

A memory device includes a multi gate field effect transistor (MuGFET) having a fin with a contact area. A programmable memory element abuts the fin contact area.

11 Claims, 6 Drawing Sheets

… (1)

RESISTIVE MEMORY AND METHOD

REFERENCE TO RELATED APPLICATIONS

This application is a Divisional of U.S. patent application Ser. No. 11/687,365, filed on Mar. 16, 2007, entitled "Resistive Memory and Method", incorporated herewith in its entirety.

BACKGROUND

Programmable resistive memories, such as phase change random access memory (PC-RAM), conductive bridge random access memory (CB-RAM), resistive random access memory (R-RAM), nano-random access memory (NRAM), or oxide-resistive memory (OX-RAM), are considered as promising candidates for future non-volatile memories. They may be integrated with planar bulk metal oxide semiconductor field effect transistor (MOSFET) technology platforms due to their low power operation and low integration overhead, as they require few steps to form.

Current prototype programmable resistive RAMs may be based on conventional planar bulk MOSFETs, where the resistive memory element is typically implemented as multiple layers above a contact hole in a vertical manner. Programmable resistive memory cells can be used as stand alone memory or as embedded memory within a CMOS logic technology to facilitate non-volatile data storage in applications such as automotive microcontrollers, field-programmable gate arrays, and communications ICs.

While memory cell size is a key figure of merit for stand alone memories, the capability of a simple and cost-efficient integration of the resistive memory cell on top of a CMOS logic technology is of great relevance. A disadvantage of the current approach is that the vertical fabrication of a programmable volume of the resistive memory material in between the metallization layers generates topological height differences in areas with resistive memories and areas without memories, where CMOS circuits are implemented.

In the case of a PC-RAM, the programmable volume is placed between a heater and a top electrode. These topological height differences are undesirable for fabrication of CMOS circuits with typically 6-9 metal layers. Moreover, the size of the programmable volume determines write speed and required current, as well as the magnitude of a reset current. For high performance and low power operation, it is desirable to minimize the programmable volume with desirable write speeds and current requirements.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

A memory cell has a resistive memory element that is coupled to a fin of a multi gate field effect transistor (MuGFET) select device. A programmable resistive memory element is generally thought of as an element whose resistance can be changed between two states, and then measured through interaction with the fin of the MuGFET select device. The resistance is typically changed by application of a write or reset current to flowing through the programmable volume of the memory cell, and then read by a lower current. For a PC-RAM based programmable volume, heating of the volume is used to change resistance, for example by applying a current or voltage. Other types of resistive memory elements may be programmed in different ways consistent with their properties. Various embodiments are described, including different types of resistive memory elements, different fin cross sections, and an array of such elements including word lines and bit lines to provide a non-volatile random access memory array.

Figure 1:
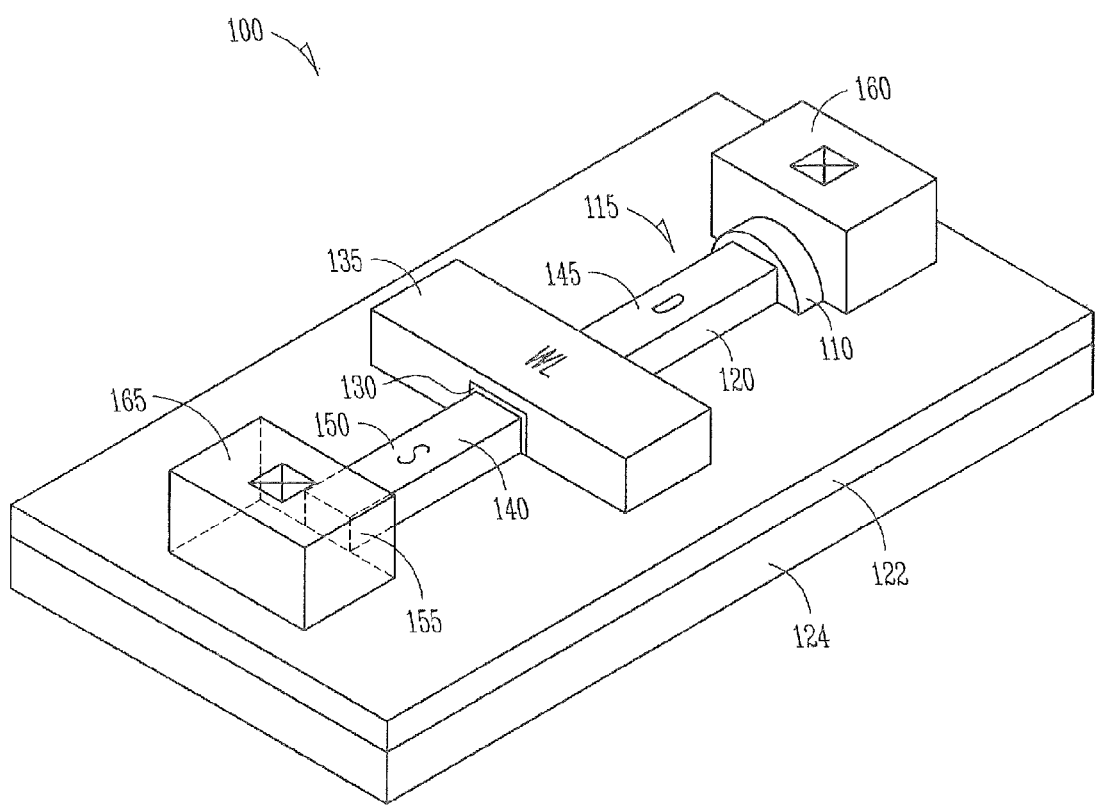
FIG. 1 is a block perspective diagram of a memory cell having resistive memory element with a multi-gate field effect transistor select device according to an example embodiment.

FIG. 1 is a block perspective diagram of an example memory cell 100 having a resistive memory element 110 with a multi-gate field effect transistor (MuGFET) select device 115 according to an example embodiment. MuGFET select device 115 may be formed of a single n-type or p-type fin transistor that has a body 120, also referred to as a fin 120. The fin may be formed on an insulating surface 122 of a substrate 124 such that the MuGFET is electrically isolated from the substrate 124. The insulating surface may be a buried oxide or other insulating layer 122 over a silicon substrate or other semiconductor substrate 124. A gate dielectric 130 may be formed over the top and on the sides of the semiconductor fin 120. A gate electrode 135 may be formed over the top and on the sides of the gate dielectric 130 and may include a metal layer. Gate electrode 135 may be coupled to a word line for memory cell 100. Source 140 and drain 145 regions may be formed in the semiconductor fin 120 on either side of the gate electrode 135, and may be laterally expanded to be significantly larger than the fin 120 under the gate electrode 135 in various embodiments.

The fin 120 has a top surface 150 and laterally opposite sidewalls 155. The semiconductor fin has a height or thickness equal to T and a width equal to W. The gate width of a single fin MuGFET transistor is equal to the sum of the gate widths of each of the three gates formed on the semiconductor body, or, T+W+T, which provides high gain. Specific implementations of a MuGFET may have a thicker insulating layer on the top surface 150 and a thinner insulating layer on the sidewalls 120 so that the current flow on the top surface can be suppressed and the gate width is approximately 2 T. This variation of the MuGFET is referred to as a FinFET. Better noise isolation may result from forming the transistors on an insulator 122. Formation on the insulator provides isolation between devices, and hence the better noise isolation. It further alleviates the need for multiple large well areas to reduce leakage currents, further leading to reduced real estate needs. Having the gate traverse two or more sides of the fin or channel results in much smaller off currents and higher switching currents due to the three dimensional nature of MuGFETs than prior bulk CMOS devices. Small off-currents are desirable to achieve small overall leakage current in a large memory array. Higher switching currents allow for fast memory operation.

Fin 120 abuts or contacts resistive memory element 110 with a contact area corresponding to its cross section of T×W. The memory element 110 is at an interface between the fin 120 and a contact block 160 composed of silicon or other material, in one embodiment. A programmable volume portion of memory element 110 abuts the contact area at the distal end of fin 120. In some embodiments, the programmable volume portion and its surface area in contact with fin 120 is kept small to increase the current density to be delivered to the programmable volume portion for writing to it and resetting it.

Contact block 160 serves as a landing pad for a contact hole. A further contact block 165 is coupled to source 140. Contact block 165 may also be coupled to ground in one embodiment. Select device 115 and resistive memory element 110 are thus arranged in a lateral manner. The benefit of this lateral arrangement of the resistive memory element 110 abutted to a MuGFET access device is to achieve a small programmable volume since the drain of the fin already has typically very small dimensions such as T=10–80 nm and W=5–80 nm. In addition the complete memory cell is fabricated below the first metallization level and hence step height differences are avoided.

The contact area of the end of fin 120 which abuts the programmable volume portion of resistive memory element 110 is relatively small and is determined by the fin width and fin height at the end of the fin. Currently, fin widths of approximately 10 to 30 nanometers or wider, and fin heights between approximately 10 to 80 nanometers provide the ability to drive current to a very small programmable volume without difficulty or increased overhead where the cross section of the fin contacts the memory element 110. The fin width and height may vary further in further embodiments.

Processing of the resistive memory cell is done after the MuGFET devices are fabricated and before the fin and contact areas are silicided. Usually the drain and source regions of a MuGFET may be silicided, i.e. the silicon outside of the channel and spacer region is transferred into a metal silicide such as CoSi, TiSi, or NiSi, or other silicides to lower the parasitic devices resistance. To implement the resistive memory in one embodiment, a small gap between MuGFET drain region 145 and contact area 160 is etched. After etching a material is locally deposited in this gap which exhibits the desired resistive switching effect. Unnecessary material outside of the contact area may be removed using a further lithography and etch process. Other methods may also be used to implement the resistive memory element.

In various embodiments, the programmable volume of resistive memory element 110 may be a phase change random access memory (PC-RAM), a conductive bridge random access memory (CB-RAM), a resistive random access memory (R-RAM), nano-random access memory (NRAM), oxide-resistive memory (OX-RAM) or other form of programmable volume. In one embodiment, the PC-RAM may be formed from Chalcogenide alloys. Other memory elements that can be modified, such as programmed or changed by application of various currents may also be used. The MuGFET select device fin 120 provides the ability to deliver high currents in a small cross section, which may expand the types of programmable resistive memory elements that may be used.

Figure 2:
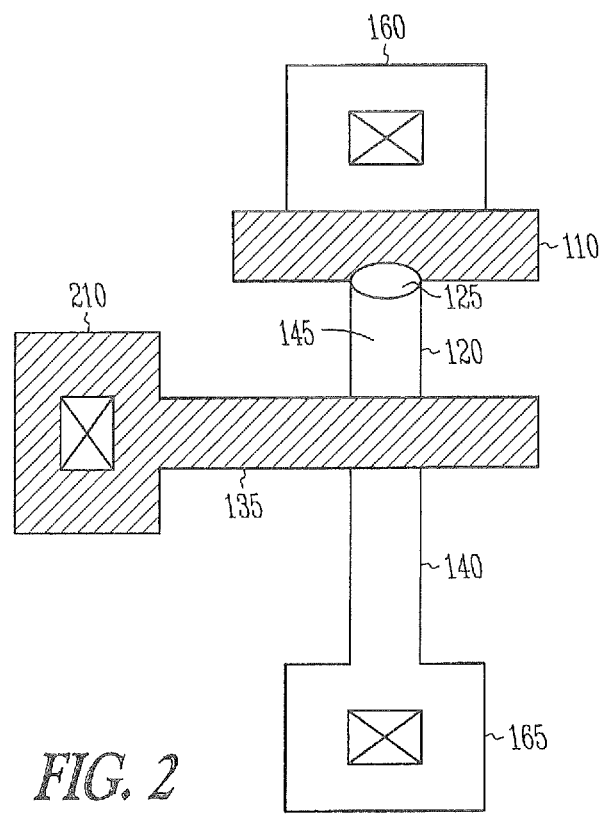
FIG. 2 is a top view of the memory cell of FIG. 1 according to an example embodiment.

FIG. 2 is a top view of the memory cell 100 of FIG. 1 according to an example embodiment. The programmable volume portion 125 of memory element 120 is abutting the contact area at the end of fin 120. FIG. 2 also includes a landing pad or contact block 210 that may be coupled to the gate 135, serving as a contact to a word line.

Figure 3:
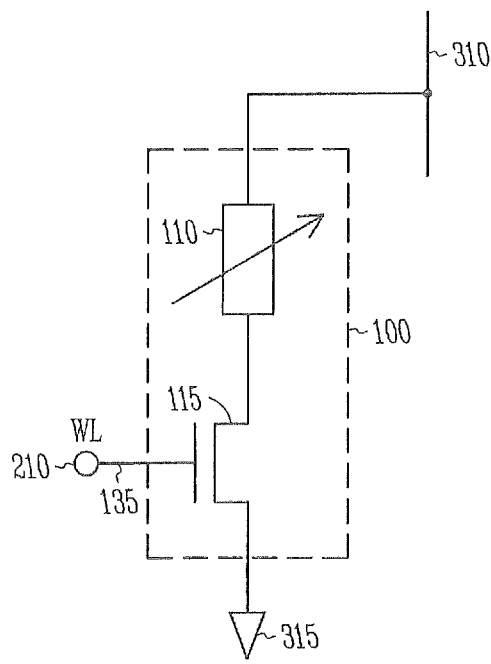
FIG. 3 is an example circuit diagram of the memory cell of FIG. 1.

FIG. 3 is an example circuit diagram of the memory cell of FIG. 1. The MuGFET select device 115 in this embodiment is coupled in series with resistive memory element 110, which is then coupled to bit line 310. In this example the resistive memory is placed at the drain contact of the MuGFET, while the MuGFET source contact is connected to ground. During read and write operation a current flows from the bitline 310 through the resistive memory 110 and MuGFET 115 to ground 315.

Figure 4:
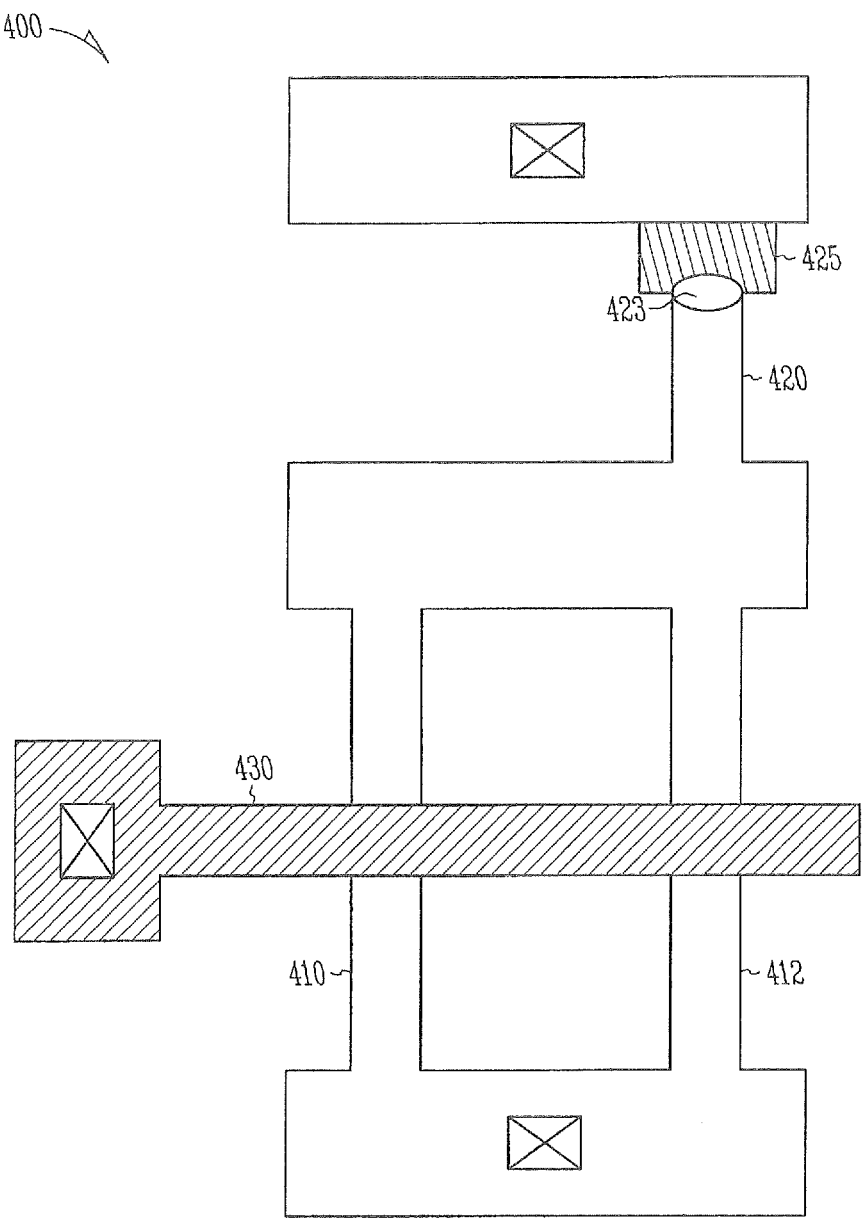
FIG. 4 is a top view of an alternative memory cell having a multiple fin multi-gate field effect transistor select device according to an example embodiment.

FIG. 4 is a top view of an alternative memory cell 400 having a multiple fin multi-gate field effect transistor select device according to an example embodiment. In one embodiment, a dual fin 410, 412 MuGFET is used as an access or select device. The dual fins are coupled to an extended single fin 420, which has a cross section contacting programmable volume portion 423 of a memory element 425. The dual fins 410 and 412 are controlled by a common gate 430, which traverses multiple planes of both fins, such as both sides and a top surface of the fins. This arrangement increases transistor drive current by the use of two fins, and providing the current of both to a desired cross sectional area single fin contact with the programmable volume portion 423 of memory element 425. The use of multiple fins allows modification of write time, write current and reset current. Transistor parameters may be modified by selecting one, two or more fins to meet desired currents for specific PC-RAM or CB-RAM, R-RAM, NRAM, OX-RAM materials.

Figure 5:
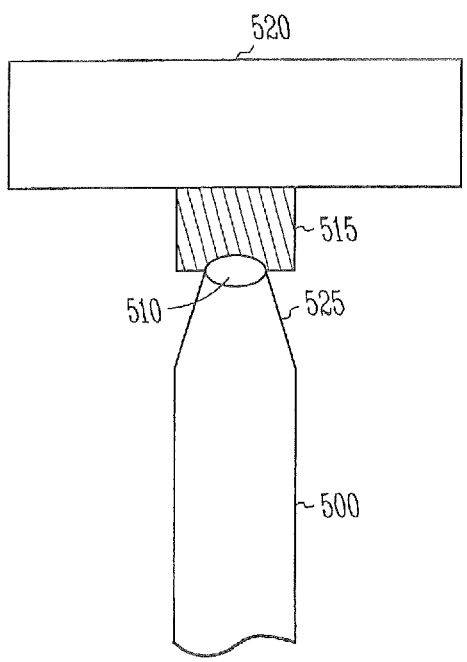
FIG. 5 is a top view of an alternative contact to a resistive memory element according to an example embodiment.

FIG. 5 is a top view of an alternative contact to a resistive memory element according to an example embodiment. A fin 500 has a modified contact area, sometimes referred to as a fin end, abutting a programmable volume portion 510 of a memory element 515. The memory element 515 is then coupled to a contact pad 520 in one embodiment, but may be otherwise electrically coupled to further circuitry if desired. The contact area at the end of fin 500 may have different shapes to modify the electrical characteristics of the memory cell, such as its reset and set times, thermal coupling, etc. Fin 500 has a triangularly shaped region adjacent the contact area 525 at the end of the fin. This longitudinal taper provides a reduced contact area that enables a point contact with the programmable volume. A point contact is a contact area that is less than that of an untapered fin. In some embodiments, it may also refer to the memory element 515 having a larger surface area than the surface area of the contact area of the fin 500.

Figure 6:
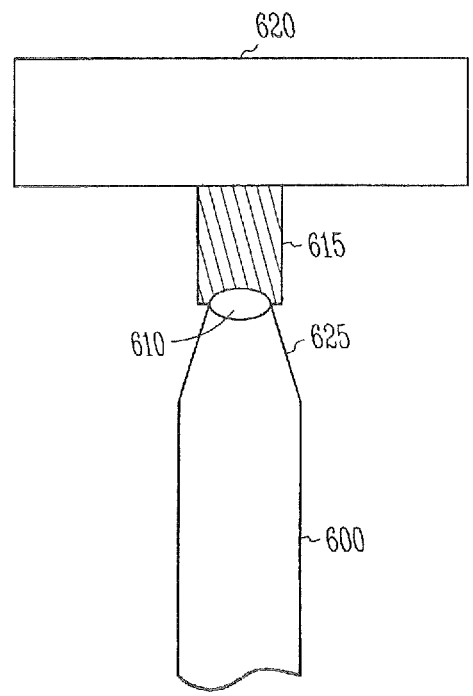
FIG. 6 is a top view of a further alternative contact to a resistive memory element according to an example embodiment.

FIG. 6 is a top view of a further alternative contact to a resistive memory element according to an example embodiment. A fin 600 has a modified contact area, sometimes referred to as a fin end, abutting a programmable volume portion 610 of a memory element 615. The memory element 615 is then coupled to a contact pad 620 in one embodiment, but may be otherwise electrically coupled to further circuitry if desired. The contact region may be may have different shapes to modify the electrical characteristics of the memory cell, such as reset and set times, thermal coupling, etc. Fin 600 has a triangularly shaped region 625 or longitudinal taper that enables a reduced contact area at the distal end of the fin. In this embodiment, however, the contact area is larger than the corresponding cross sectional area of the body of memory element 615.

Figure 7:
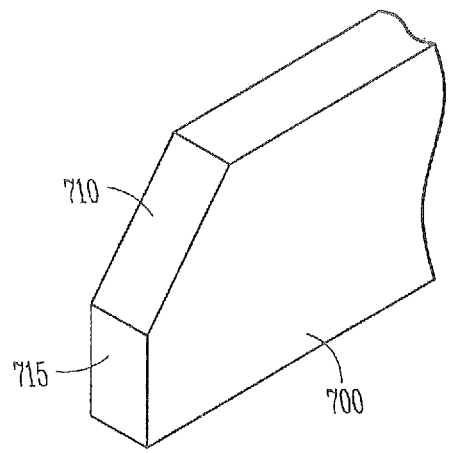
FIG. 7 is a perspective view of an alternative contact to a resistive memory element according to an example embodiment.

FIG. 7 is a perspective view of an alternative contact to a resistive memory element according to an example embodiment. A fin 700 has a vertical taper 710 that ends in a reduced contact area 715. The reduced contact area may be abutted against a programmable volume portion of a resistive memory element that has a corresponding cross section that is larger, smaller or the same size to obtain desired electrical characteristics.

Figure 8:
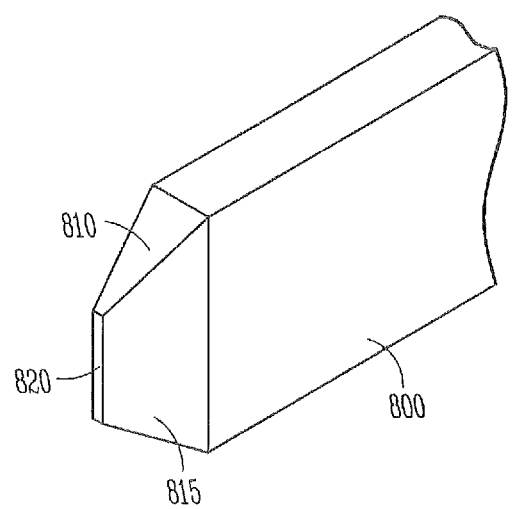
FIG. 8 is a perspective view of a further alternative contact to a resistive memory element according to an example embodiment.

FIG. 8 is a perspective view of a further alternative contact to a resistive memory element according to an example embodiment. A fin 800 has a vertical taper 810 and a longitudinal taper 815 that end in a reduced contact area 820. The reduced contact area may be abutting a resistive memory element that has a corresponding cross section that is larger, smaller or the same size as the contact area to obtain desired electrical characteristics. The various modifications to the fin to obtain different fin contact area cross sections in combination with modifications to the cross section and volume of the programmable volume portion of the memory element enable memory operation to be modified to obtain desired characteristics.

The lateral and vertical shaping of the fin contact areas 510, 610, 715, and 820 can be achieved by modifying the control parameters of the etch process which forms the gap between fin and contact block 160.

In one embodiment, fins may be silicided to achieve a desired reduced parasitic resistance. The fins may be formed without silicide to obtain a higher parasitic resistance. Conventional MuGFET CMOS logic processes may include silicided fins outside of fin forming spacer regions on the source/drain contact areas to minimize parasitic resistances. A silicided blocking mask may be used to prevent silicidation at the contact area of the fin to the programmable volume memory element. A silicided blocking mask may also be used near the contact areas during epitaxial growth that may be performed to increase the silicon volume of transistor regions outside the fins to further minimize parasitic resistance. Such a mask may also help prevent growth of the fin near the contact areas.

Figure 9:
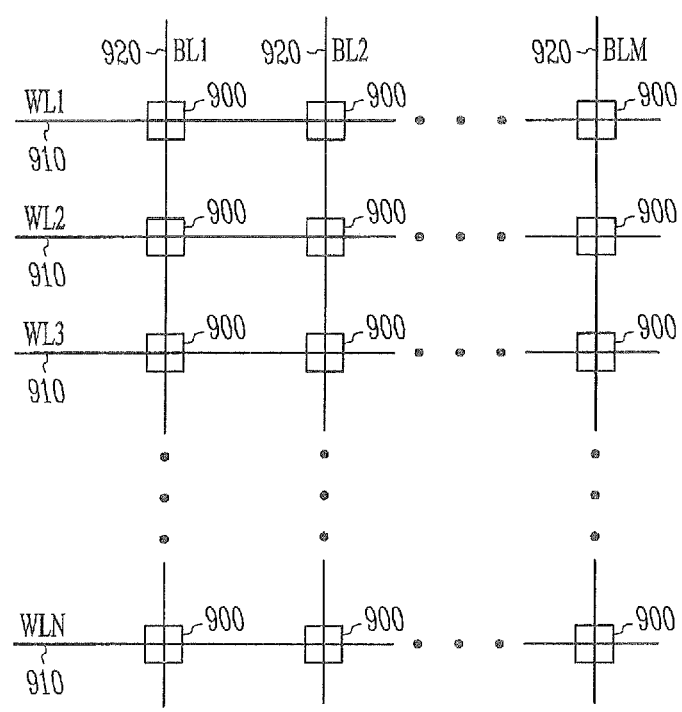
FIG. 9 is a block diagram illustrating an array of memory cells with corresponding word lines and bit lines according an example embodiment.

FIG. 9 is a block diagram illustrating an example array of memory cells 900 with corresponding word lines 910 and bit lines 920. Each memory cell 900 may include a MuGFET select device having a fin with a cross section that contacts a resistive memory element. N word lines are illustrated, each contacting a row of memory cell 900 gates as described above. M bit lines are illustrated, each contacting a column of memory cell 900 memory elements. This forms an N×M array of memory cells that are independently accessible by use of select circuitry which is not shown.

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

The invention claimed is:

1. A method of interacting with a resistive memory, the method comprising:
    controlling current through a fin or multiple connected fins of a multi gate field effect transistor; and
    interacting with a programmable volume portion of a resistive memory element abutting an end of the fin,
    wherein the multi gate field effect transistor and the programmable volume portion are laterally disposed from one another.

2. The method of claim 1 wherein interacting comprises applying a write current.

3. The method of claim 1 wherein interacting comprises applying a reset current.

4. The method of claim 1 wherein interacting comprises applying a read current.

5. The method of claim 1, wherein the end of the fin abutting the resistive memory element is tapered from a first cross section area associated with a drain terminal of the multi gate field effect transistor to a second cross sectional area associated with the programmable volume portion, and wherein the first cross sectional area is larger than the second cross sectional area.

6. The method of claim 5, wherein the taper comprises a vertical taper of the end of the fin.

7. The method of claim 6, wherein the taper further comprises a longitudinal taper of the fin.

8. The method of claim 1, wherein a gate of the multi gate field effect transistor is coupled to a word line, and wherein controlling current comprises applying a voltage to the word line.

9. The method of claim 8, wherein a drain of the multi gate field effect transistor is coupled to a bit line, and a source of the multi gate field effect transistor is coupled to a predetermined potential, and wherein controlling current comprises controlling a current traveling through the bit line and multi gate field effect transistor to the predetermined potential.

10. The method of claim 1, wherein an active portion of the programmable volume portion is defined by a cross sectional area of the end of the fin abutting the programmable volume portion.

11. The method of claim 1, wherein the multi gate transistor comprise multiple connected fins that are configured to be selectively controlled, and wherein controlling current comprises selectively conducting current through one or more of the multiple connected fins to provide for a selective modification of one of write time or write current during a write operation, or a selective modification of a reset current during a reset operation.

* * * * *